United States Patent
Chan et al.

[11] Patent Number: 5,831,326
[45] Date of Patent: Nov. 3, 1998

[54] SEMICONDUCTOR DEVICE WITH RESISTIVE LOAD ELEMENT

[75] Inventors: Tsiu Chiu Chan, Carrollton; William A. Bishop, Irving, both of Tex.

[73] Assignee: STMicroelectronics, Inc., Carrollton, Tex.

[21] Appl. No.: 552,440

[22] Filed: Nov. 3, 1995

Related U.S. Application Data

[62] Division of Ser. No. 226,761, Apr. 12, 1994, abandoned, which is a division of Ser. No. 911,975, Jul. 10, 1992, Pat. No. 5,330,933, which is a division of Ser. No. 298,530, Jan. 18, 1989, Pat. No. 5,196,233.

[51] Int. Cl.$^6$ .............................. H01L 9/02; H01L 27/02
[52] U.S. Cl. ..................... 257/551; 257/350; 257/351; 257/359; 257/328; 257/355; 257/357; 257/377; 257/538
[58] Field of Search ..................... 257/350, 351, 257/358, 359, 363, 378, 380, 381, 756, 760, 328, 288, 355, 356, 360, 379, 385, 481, 538, 539, 546, 551, 552, 603, 367, 377, 357

[56] References Cited

U.S. PATENT DOCUMENTS

| | | | |
|---|---|---|---|
| 4,178,674 | 12/1979 | Liu et al. | 437/47 |
| 4,180,826 | 12/1979 | Shappir | 437/49 |
| 4,214,917 | 7/1980 | Clark et al. | 437/46 |
| 4,290,185 | 9/1981 | McKenny et al. | 437/46 |
| 4,367,580 | 1/1983 | Guterman | 437/46 |
| 4,370,798 | 2/1983 | Lien et al. | 437/46 |
| 4,505,026 | 3/1985 | Bohr et al. | 437/193 |
| 4,554,729 | 11/1985 | Tanimura et al. | 437/47 |
| 4,560,419 | 12/1985 | Bourassa et al. | 437/46 |
| 4,561,907 | 12/1985 | Raicu | 437/46 |
| 4,619,037 | 10/1986 | Taguchi et al. | 437/195 |
| 4,755,480 | 7/1988 | Yan et al. | 257/380 |

(List continued on next page.)

FOREIGN PATENT DOCUMENTS

| | | |
|---|---|---|
| 58-135653 | of 0000 | Japan . |
| 0135653 | 8/1983 | Japan . |
| 59-167051 | 9/1984 | Japan . |

OTHER PUBLICATIONS

IEEE Trans. Electron. Dev., vol. 32, No. 9, Sept. 1985, "Ion–Implanted Thin Polycrystalline High–Value Resistors for High–Density Poly–Load Static Ram Applications," Ohzone et al.

IEEE Trans. Electron. Dev., vol. 4, No. 2, Feb. 1993, "Experimental Characterization of the Diode–Type Polysilicon Loads for CMOS SRAM," Kalnitsky et al., pp. 358–363.

IEEE Trans. Electron. Dev., vol. 30, No. 1, Jan. 1993, "Gigaohm–Range Polycrystalline Silicon Resistors for Microelectronic Applications," Mohan et al., pp. 45–51.

IEEE J. of Solid State Cir., vol. 18, No. 5, Oct. 1983, "A 4.5 ns Access Time 1K x 4 Bit ECL RAM," Hwang et al., pp. 515–520.

(List continued on next page.)

*Primary Examiner*—Tom Thomas
*Assistant Examiner*—Fetsum Abraham
*Attorney, Agent, or Firm*—David V. Carlson; Theodore E. Galanthay; Lisa K. Jorgenson

[57] ABSTRACT

A method for fabricating a resistive load element for a semiconductor device can be used with standard semiconductor processes. A layer of second level poly is deposited and lightly doped P-type. A resist mask is used to dope selected regions of the poly layer N-type. The poly layer is then patterned to define conductors and resistive load elements. The resistive load elements are formed by back-to-back PN diodes formed at the interfaces between the P-type and N-type regions.

2 Claims, 4 Drawing Sheets

U.S. PATENT DOCUMENTS

| | | | |
|---|---|---|---|
| 4,796,081 | 1/1989 | Cheung et al. | 257/757 |
| 4,805,147 | 2/1989 | Yamanaka et al. | |
| 4,872,042 | 10/1989 | Baba et al. | 257/359 |
| 4,877,483 | 10/1989 | Bergemont et al. | 437/191 |
| 4,905,068 | 2/1990 | Satoh et al. | 257/296 |
| 4,950,620 | 8/1990 | Harrington III | 437/60 |
| 4,966,864 | 10/1990 | Pfiester | 437/191 |
| 5,151,376 | 9/1992 | Spinner III | 437/60 |
| 5,187,114 | 2/1993 | Chan et al. | 437/60 |
| 5,198,382 | 3/1993 | Campbell et al. | 437/918 |
| 5,365,099 | 11/1994 | Phipps et al. | 257/539 |
| 5,397,914 | 3/1995 | Suda et al. | 257/551 |
| 5,502,338 | 3/1996 | Suda et al. | 257/551 |

OTHER PUBLICATIONS

IEEE J. of Solid State Cir., vol. 24, No. 2, Apr. 1989, "A Bipolar ECL Static RAM Using Polysilicon Diode Loaded Memory Cell," Hwang et al., pp. 504–511.

IEEE GaAs IC Syposium, 1984, Hyashi et al., "ECL–Compatible GaAs SRAM Circuit Technology for High Performance Computer Applications," pp. 111–114.

IEEE J. of Solid State Cir., vol. 21, No. 5, Oct. 1986, "A 1.0 ns 5–Kbit ECI RAM," Chuang et al., pp. 670–674.

Physics of Semiconductors, S.M. Sze, 1981, pp. 304–305.

Solid State Elect., vol. 30, No. 3, pp.339–343, 1987, "Characterization of Aluminum/LPCVD Polysilicon Schottky Barrier Diodes," Chen et al.

Solid State Elect., vol. 28, No. 12, pp. 1255–1261, 1985, "Field Enhanced Emission and Capture in Polysilicon pn Junctions," Greve et al.

Solid State Electronics, vol. 15, pp. 1103–1106, 1972, "P–N Junctions in Polycrystalline Silicon Films," Manoliu et al.

1989 Symposium on VLSI Technology, Digest of Technical Papers, pp. 61–62, May 22–25, "A New Process Technology for a 4Mbit SRAM With Polysilicon Load Resistor Cell," Yazuriha et al.

Silicon Processing for the VLSI Era, vol. 2—Process Integration, pp. 84–85, 176–177, x–xv, 1986, Wolf.

Hardee, et al. A Fault–Tolerant 30 ns/375 mW 16K x 1 NMOS Static RAM. IEEE Journal of Solid State Circuits, v 16, 435 (1981).

Kang, et al. A 30 ns 6K x 1 Fully Static RAM. IEEE Journal of Solid State Circuits, v 16, 444 (1981).

Yu, et al. HMOS–CMOS —A Low–Power High–Performance Technology. IEEE Journal of Solid State Circuits, v 16, 454 (1981).

Isobe, et al. An 18 ns CMOS/SOS 4K Static RAM. IEEE Jounal of Solid State Circuits, v 16, 460 (1981).

Minato, et al. A Hi–CMOSII 8K x 8 Bit Static RAM. IEEE Journal of Solid State Circuits, v 17, 793 (1982).

Ochii, et al. An Ultralow Power 8K×8–Bit Full CMOS With a Six–Transistor Cell. IEEE Journal of Solid State Circuits, v 17, 798 (1982).

Ohzone, et al. An 8K×8 bit Static MOS RAM Fabricated by n–MOS/n–Well CMOS Technology. IEE Journal of Solid State Circuits, v 15, 854 (1980).

Minato, et al. A High–Speed Hi–CMOSII 4K Static RAM. IEEE Journal of Solid State Circuits, v 16, 449 (1981).

Anami, et al. A 35 ns 16K NMOS Static RAM. IEEE Journal of Solid State Circuits, v 17, 815 (1982).

Uchida, et al. A Low Power Resistive Load 64 kbit CMOS RAM. IEEE Journal of Solid State Circuits, v 17, 804 (1982).

Wada, et al. A 16 DIP, 64 kbit, Static MOS–RAM. IEEE Journal of Solid State Circuits, v 16, 488 (1981).

Ishikawa, et al. An Mo Gate 4K Static MOS RAM. IEEE Journal of Solid State Circuits, v 15, 651 (1980).

Minato, et al. 2K×8 Bit Hi–CMOS Static RAM's. IEEE Journal of Solid State Circuits, v 15, 656 (1980).

Wada, et al. A 15–ns 1024–Bit Fully Static MOS RAM. IEEE Journal Of Solid State Curcuits, 635 (1978).

Kang et al. A 30 ns 16x1 Fully Static RAM. IEEE Journal of Solid State Circuits, 18, (1981).

Masuhara, et al. 2K×8b HCMOS Static RAMS. IEEE Journal of Solid State Circuits, 224 (1980).

Furnweger, Charles. Dynamic Interfacing, Spare Cells Raise 16–K Static Ram's Speed and Yield. Electronics, 121 (1982).

Sud, et al. 16–K Static RAM Takes New Route to High Speed. Electronics, 117 (1980).

Dutoit, et al. Lateral Polysilicon p–n Diodes. J. Electrochem. Soc., v. 125, 1648 (1978).

Dutoit. Influence of Impurities on Lateral Polysilicon pn Diodes. J. Electrochem. Soc. v 130, 967 (1983).

Saito, et al. I–V Characterisctics of Polycrystalline Silicon with n$^+$pn$^+$ Structure. J. Appl. Phys., v 15, 1190 (1985).

Liu, et al. A High–Perfromance MOS Technology for 16K Static RAM. IEDM, 352 (1979).

Iuzuka, et al. Variable Resistance Polysilicon for High Density CMOS RAM. IEDM, 370 (1979).

Morimoto, et al. High Speed 4 kbit Static RAM With Silicone Coated Wiring. Japanese Journal of Applied Physics, v 20, 123 (1981).

Choi, et al. Fabrication of Polysilicon Resistors Compensated With Double Ion–Implantation. Abstract No. 516, 754 (1984).

Rideout, V. Leo. Future Directions in MOSFET Random Access Memories. 4 (1980).

Taubenest, et al. Polycrystalline Silicon Integrated Thin Film Resistors.

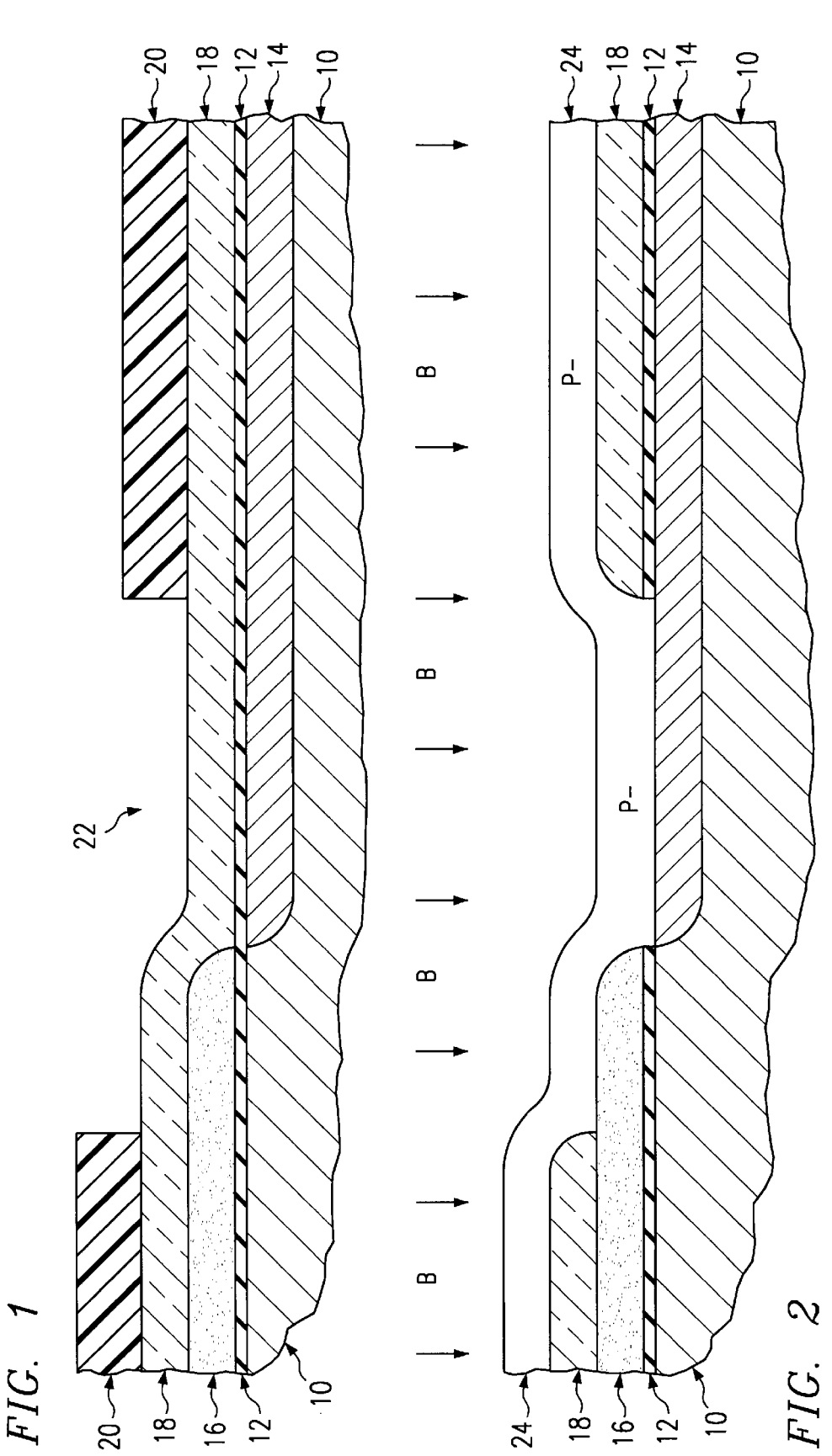

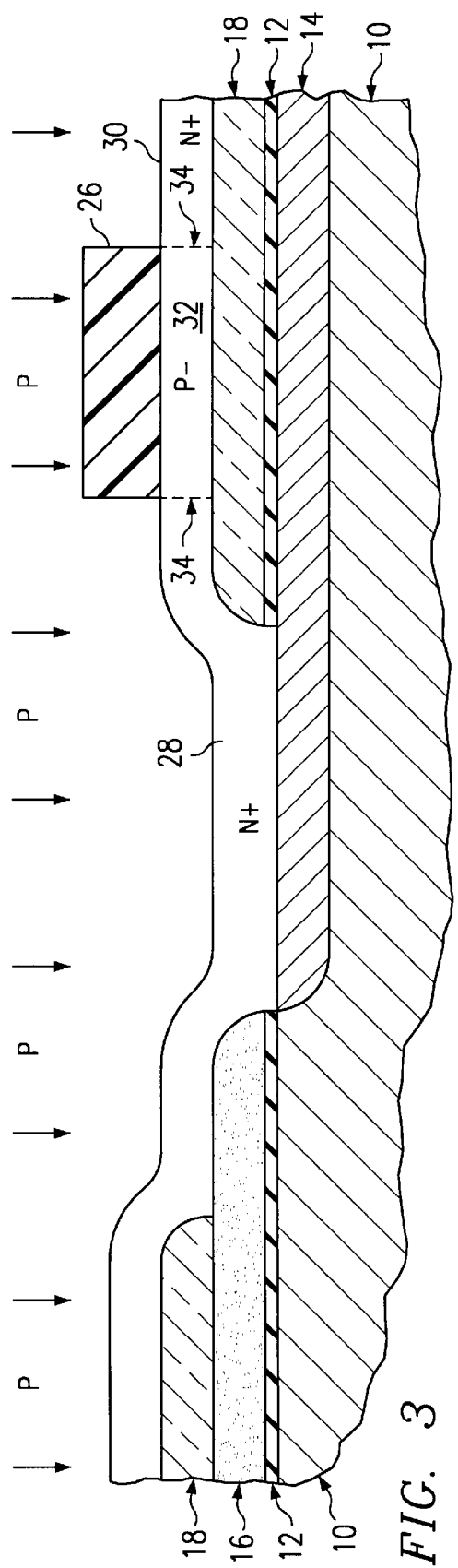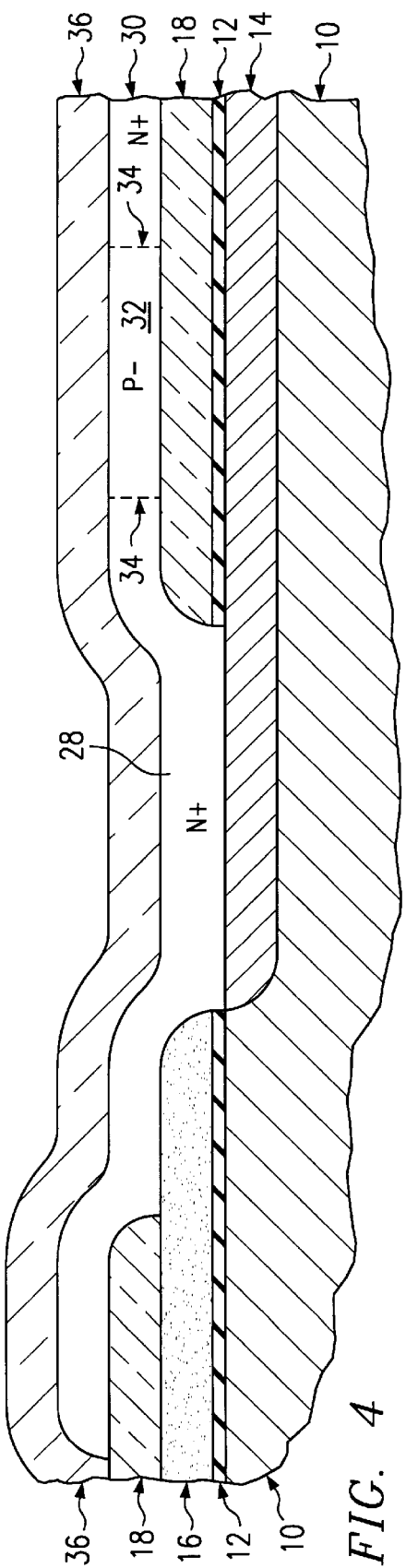

SEMICONDUCTOR DEVICE WITH RESISTIVE LOAD ELEMENT

This is a Continuation, of application Ser. No. 08/226,761, filed Apr. 12, 1994, abandoned Apr. 8, 1997 which is a divisional of application Ser. No. 07/911,975, filed Jul. 10, 1992, now U.S. Pat. No. 5,330,933 issued Jul. 19, 1994, which in turn is a divisional of application Ser. No. 07/298,530, filed Jan. 18, 1989, now U.S. Pat. No. 5,196,233 issued Mar. 23, 1993.

BACKGROUND OF THE INVENTION

1. Field of the Invention

The present invention relates generally to semiconductor circuit fabrication, and more specifically to a method for fabricating a resistive load element in polycrystalline silicon.

2. Description of the Prior Art

In integrated circuit fabrication, some digital circuits require a resistive load. An illustrative circuit which requires such a resistive load is an NMOS static random access memory (SRAM).

The term resistive load is used to mean elements which provide a resistance to the flow of electrical current. The voltage drop across such element is not generally required to vary precisely linearly with current in digital circuits. Resistive load elements have been fabricated from Field Effect Transistors (FET) having their gates tied to their drains. Back-to-back diodes have been used to create an element formed of two junctions defining regions having alternating conductivity types. Since some current must flow through a resistive load element, the reverse-biased diode of the pair must be "leaky."

As is known in the art, introducing additional high temperature process steps to the fabrication of an integrated circuit is generally undesirable. High temperature processing causes diffusion of the impurities dopants in the integrated circuit, causing junctions to move. Low temperature processing steps, those below approximately 700° C., generally do not adversely affect the integrated circuit being fabricated. Other steps, such as growing silicon dioxide ($SiO_2$) may require temperatures of 900° C. or more. Such high temperature steps cause dopant diffusion, which is undesirable, especially in later processing stages. It is generally desirable to minimize the number of such high temperature process steps during the fabrication of an integrated circuit.

It would be desirable to provide a semiconductor fabrication process which provides back-to-back diodes suitable for use as resistive load elements. It would also be desirable for all of the process steps necessary to fabricate such resistive load elements to involve only low temperature processing steps.

SUMMARY OF THE INVENTION

It is therefore an object of the present invention to provide a low temperature semiconductor fabrication process for forming back-to-back diodes suitable for use as a resistive load element for digital circuits.

It is another object of the present invention to provide a low temperature semiconductor fabrication process for forming back-to-back diodes which can be easily used with nearly any standard semiconductor fabrication process flow.

It is yet another object of the present invention to provide such a low temperature semiconductor fabrication process which can be used to provide resistive load elements for SRAMs.

It is a further object of the present invention to provide an SRAM layout which avoids complications due to unwanted conductive regions which may exist as artifacts of processing.

Therefore, a semiconductor fabrication process according to the present invention includes the steps of forming a layer of polycrystalline silicon having a first conductivity type. Regions having a second conductivity type are then formed within the polycrystalline silicon layer, which causes PN junctions to be formed at the boundaries of the regions. The polycrystalline silicon layer is then patterned so that back-to-back PN junctions (diodes) are formed within the conducting regions desired to be used as resistive load elements.

The novel features which characterize the present invention are defined by the appended claims. The foregoing and other objects and advantages of the present invention will hereafter appear, and for purposes of illustration, but not of limitation, a preferred embodiment is shown in the accompanying drawings.

BRIEF DESCRIPTION OF THE DRAWINGS

FIGS. 1–4 illustrate a process flow suitable for fabricating resistive load elements according to the present invention;

DETAILED DESCRIPTION OF THE INVENTION

Figure 5:
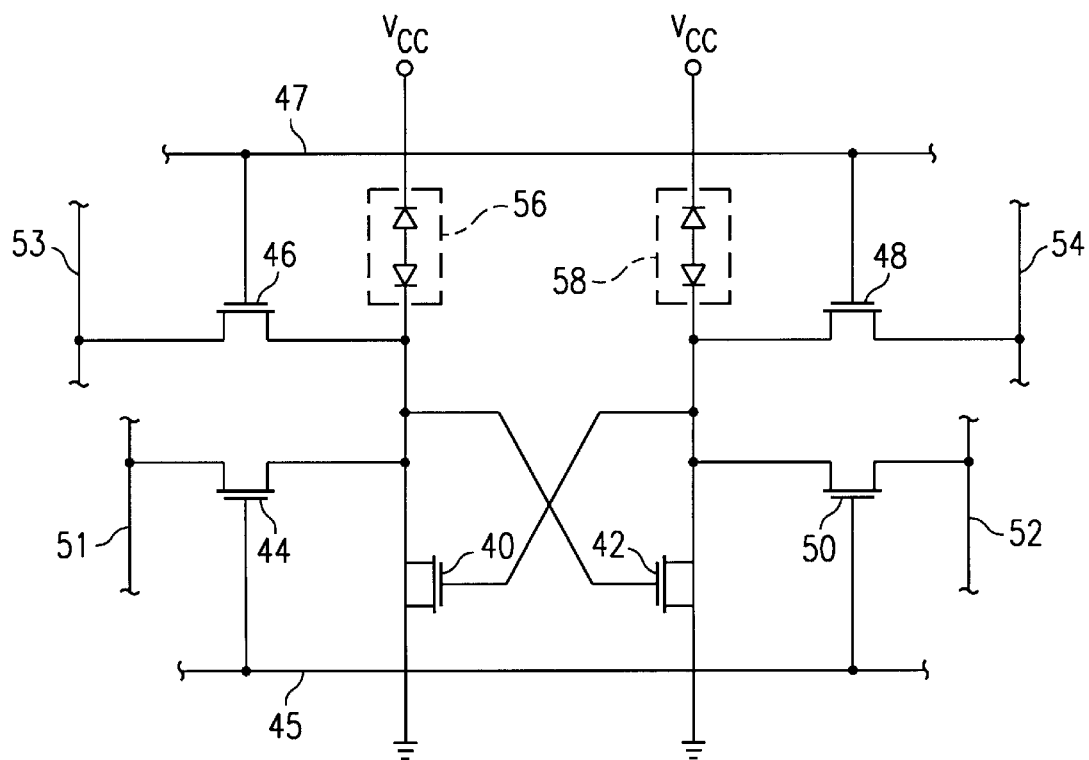
FIG. 5 is a schematic diagram of a dual-port NMOS SRAM cell which incorporates resistive load elements according to the present invention.

The present invention is a method for fabricating resistive load elements which consist of back-to-back PN diodes. As will be appreciated by persons skilled in the art in conjunction with the description which follows, this process is compatible with most current CMOS and NMOS process flows.

Referring to FIG. 1, a semiconductor substrate 10 contains the active elements of an integrated circuit. The substrate 10 contains various regions which are doped to form active and passive integrated circuit elements. In the preferred embodiment, the substrate 10 contains FET devices, but the method described below is compatible with the use of bipolar transistors in the substrate 10.

A layer of silicon dioxide ($SiO_2$) 12 functions as a gate oxide. A layer 16 of polycrystalline silicon lies on top of the oxide layer 12. The layer 16 is a first layer of polycrystalline silicon, and is patterned to provide conductive paths between various portions of an integrated circuit. This layer 16 is often referred to as first level poly or poly-1. This first level poly layer 16 is also typically used to form the gates of field effect devices (not shown). The layer 16 is doped N-type to function as a conductor, and may include a layer of silicided refractory metal, such as tantalum silicide ($TaSi_2$), in order to improve its conductivity. $N^+$ regions 14 are formed in the substrate 10 to function as FET source/drain regions.

The method of illustrating a preferred embodiment begins after the first level poly 16 has been formed and patterned and the source/drain regions 14 formed. A layer of undoped glass 18 is formed over the entire surface of the integrated circuit. This layer 18 is preferably formed using Chemical Vapor Deposition (CVD) as known in the art. A layer of photoresist 20 is spun onto the integrated circuit, and patterned to form an opening 22. The glass 18 and the gate oxide layer 12 beneath the opening 22 is etched away, preferably using a plasma etch, and the remaining resist 20 is removed. When the glass layers 18 and oxide 12 are etched, the $N^+$ region 14 and first level poly 16 are partially exposed, and can make contact with conductors as shown in FIG. 2.

Referring to FIG. 2, a second layer of polycrystalline silicon 24 is formed over the entire surface of the integrated circuit. This layer 24 is often referred to as second level poly, or poly-2. The entire polycrystalline layer 24 is then implanted with boron to make it P-type. This implant is preferably a low dosage implant, giving a boron concentration of approximately $8 \times 10^{13}$ $cm^{-2}$. This relatively light dosage causes the entire polysilicon layer 24 to become $P^-$.

Referring to FIG. 3, a layer of photoresist 26 is formed on the integrated circuit, and patterned to act as an ion implant mask. The regions covered by the resist 26 remaining after patterning are those in which the resistive load elements are to be formed. A phosphorous implant is then made, converting the exposed regions of the second level poly into $N^+$ regions 28, 30. A heavy implant is used for this step, preferably $8 \times 10^{15}$ $cm^{-2}$.

Those portions of the second level poly masked by the resist 26 remain as $P^-$ regions 32. PN junctions 34 are formed on either side of the $P^-$ region 32. These junctions 34 are those used to define the resistive load element. The remaining resist 26 is then removed.

Referring to FIG. 4, the second level poly layer including regions 28, 30, and 32, is then patterned to define resistive load elements and second level poly interconnects. A resist mask (not shown) is first patterned, and a plasma etch used to remove the unwanted poly-2 regions. This layer 28, 30 is also preferably used to define signal lines and interconnections as will be explained in more detail in connection with FIG. 6. Next, a layer of glass 36 is formed over the integrated circuit using CVD. This layer 36 preferably comprises a first layer of undoped glass, followed by a layer of phosphosilicate glass (PSG). At this time, the integrated circuit is ready for metallization. After PSG reflow to smooth the surface of the wafer, vias are cut in the glass layer 36, and metal deposited and patterned as known in the art.

Since the diode pair defined by the junctions 34 is formed in polycrystalline silicon, the diodes allow a small amount of current to flow when they are reverse biased. This is necessary to ensure proper operation of an SRAM memory cell, since one end of the defined resistive load element must be pulled to ground potential when the cell is in the proper state. The effective resistance of the resistive load elements defined as described above is very high, in the gigaohm range. The very low current flow which results allows very low power SRAM cells to be fabricated.

In the described embodiment, the second level of polycrystalline silicon 24 is patterned after the last implant is completed. This technique, as opposed to patterning the polycrystalline silicon layer prior to implant, allows the polycrystalline silicon to act as an implant stop, protecting underlaying active areas of the integrated circuit from contamination by the implant.

A circuit in which the process described above can be used to good effect is an NMOS SRAM shown in FIG. 5. This circuit is the same dual-port SRAM described in detail in U.S. Pat. No. 4,535,427, issued Aug. 13, 185, by Ching-Lin Jiang. Detailed operation and use of the circuit of FIG. 5 is described in the referenced U.S. patent, which is herein incorporated by reference.

Cross coupled transistors 40 and 42 define the SRAM cell. Transistors 44 and 46 are used to read and write data, and are driven by read and write word lines 45 and 47 respectively. Transistors 48 and 50 are used to write and read complemented data, and are also driven by word lines 47 and 45, respectively. Bit lines 51 and 52 are used to read data and complemented data from the cell through pass transistors 44 and 50, respectively. Bit lines 53 and 54 are used to write data and complementary data to the cell through pass transistors 46 and 48, respectively.

Resistive load elements 56 and 58 each comprise back-to-back diodes. Fabrication of these diodes was described in connection with FIGS. 1–4.

Figure 6:
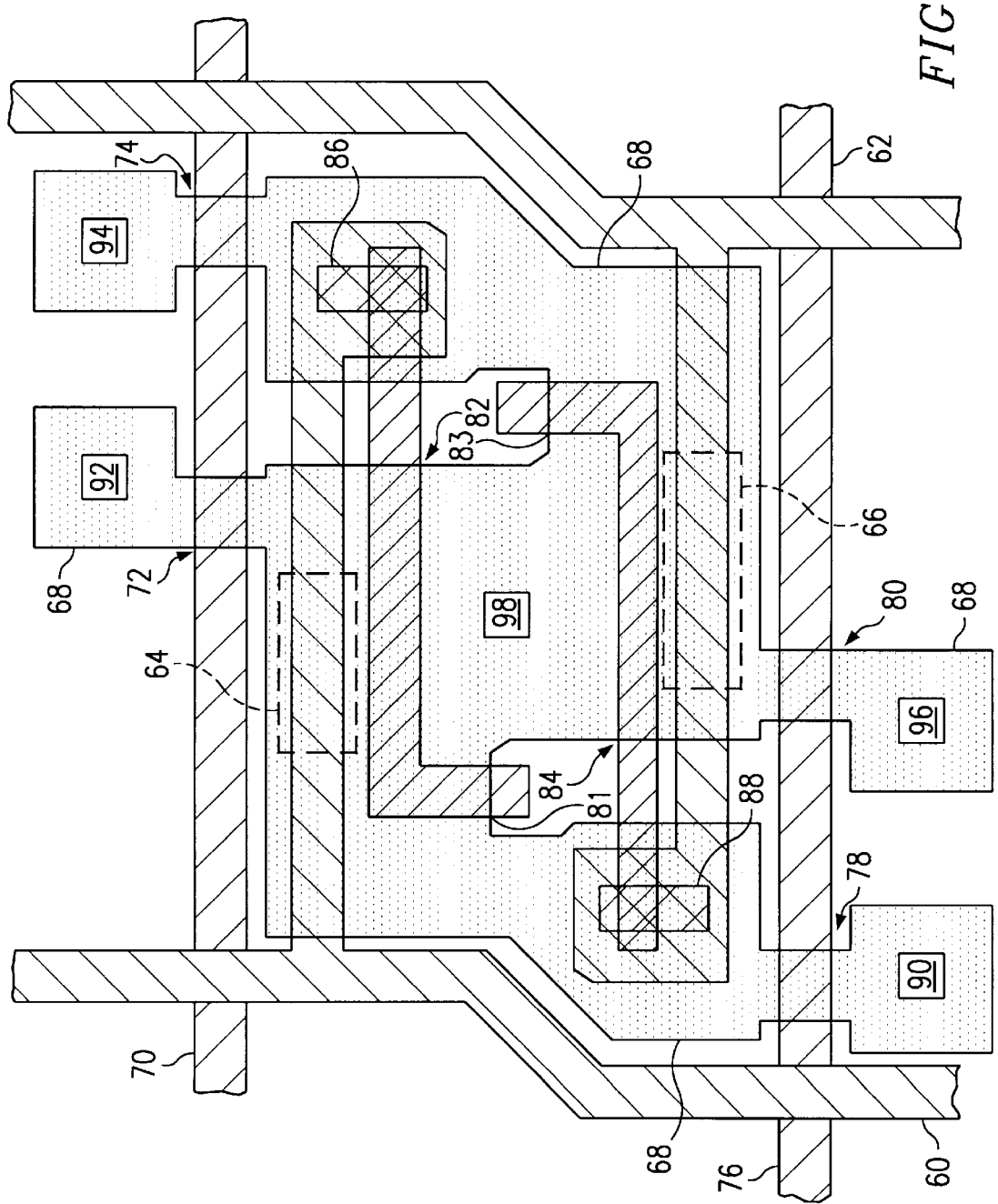
FIG. 6 is a layout for the SRAM cell of FIG. 5 within an integrated circuit.

FIG. 6 is a plan view of an integrated circuit layout for the SRAM cell shown in FIG. 5. Lines 60 and 62 are the $V_{cc}$ lines, and are formed in second level poly. Regions 64 and 66 also lie in second level poly, and are the P-type regions used to make the resistive load elements 56 and 58.

The active area of the cell is the stippled area enclosed within the boundary line 68. All of the transistors shown in FIG. 5 are formed within this area. Signal line 70, the write word line, is fabricated in first level poly, and forms the gates 72, 74 of transistors 46 and 48 respectively. Signal line 76, the read word line, is also formed in first level poly, and defines the gates 78, 80 of transistors 44 and 50 respectively.

First level poly line 81 forms the gate 82 of transistor 40. First level poly line 83 forms the gate 84 of transistor 42.

Region 86 is a shared contact region which is the common node between transistors 42, 48, 50, and the gate of transistor 40. This is preferably a shared contact such as that shown in FIG. 4, wherein second level poly makes direct contact with the first level poly 16 and with the active area 14 beneath. Region 88 is a similar shared contact region at the common node shared by transistors 40, 44, 46, and the gate of transistor 42. The shared contact regions 86, 88 are located centrally within the active areas to avoid junction leakage.

Regions 90, 92, 94, and 96 are contact regions where metal conductors (not shown) make contact directly with the active area. These contact regions are connected to metal bit lines 53, 54, 51 and 52, respectively. The metal bit lines are oriented vertically in FIGS. 6, parallel with the $V_{cc}$ lines 60 and 62.

Contact region 98 is a metal to active area contact also. The metal line (not shown) connected to the contact region 98 is the ground line to which the sources of transistors 40 and 42 are connected. This metal ground line is also oriented vertically in FIG. 6.

The five metal lines connected to contact regions 90, 92, 94, 96, and 98 are formed using standard processes known in the art. The making of the metal to active area contacts through vias is also known in the art. The five metal lines are not shown in FIG. 6 merely for the purpose of minimizing clutter in the drawing.

Since $V_{cc}$ is carried in a second level poly conductor 60, 62, only five metal lines are needed per cell. This eases metal pitch problems for a given cell size.

Figure 7:
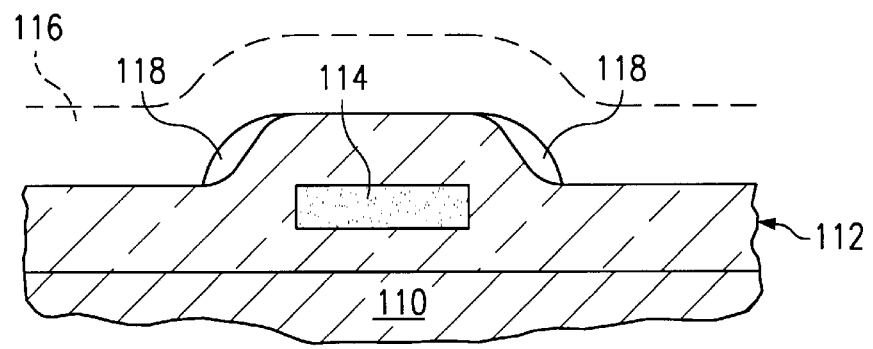
FIG. 7 is a cross-section of a portion of an integrated circuit device illustrating unwanted conductive regions which may exist as artifacts of processing.

FIG. 7 shows how second level poly "sticks", which are unwanted polycrystalline silicon conductors, can be created as artifacts of the processing steps described above. A substrate 110 is overlayed by a layer of oxide 112. A first level poly conductor 114 is located within the oxide layer 112. As part of the processing described above, a layer of second level poly 116 is placed over the entire integrated circuit. At a later stage, this layer 116 is etched away.

However, due to the nature of anisotropic plasma etching, two regions 118 are left behind along the sidewalls of the raised part of the oxide layer 112 were it passes over the first level poly conductor 114. The sidewall regions 118 are known as second level poly sticks, and will tend to run along both sides of all first level polysilicon traces in the device. Since the sticks can conduct current, operation of the cell can be adversely affected.

The layout shown in FIG. 6 has design features which eliminate any problem caused by the presence of such polysilicon sticks. These sticks may be found alongside all first level poly traces shown in FIG. 6. These first level poly traces are word lines 70 and 76, and gate lines 81 and 83.

As can be seen from an inspection of FIG. 6, any sticks associated with the gate lines 81 and 83 will cause not problems because they are connected at both ends to the same voltage potential point. There are no second level poly lines crossing the gate lines 81 and 83 to be shorted out by the poly sticks. Thus, no current will flow through these sticks.

The layout of FIG. 6 is such that any second level poly sticks which occur along side the first level poly word lines 70 and 76 are connected at both ends only to $V_{cc}$. Thus, no current will flow along the sticks, and circuit operation is not affected. If a single first level poly trace passed beneath both a $V_{cc}$ in second level poly and one of the resistive regions 64 or 66, operation of the circuit would be adversely affected. Current would tend to flow between the $V_{cc}$ line and the other second level poly line through the stick, shorting out part of the circuit.

As will be appreciated by those skilled in the art, the embodiment herein described provides a method for semiconductor processing which allows for easy fabrication of resistive load devices containing back-to-back diodes. Only a small number of extra process steps are required, and all of them are low temperature steps. Thus, the location of PN junctions in the active regions are not adversely affected by the additional processing steps.

Although the use of the described method can produce second level poly sticks due to the nature of antisotropic plasma etching, these sticks will not cause a problem with device function when devices are properly layed out.

The described method has been illustrated by an application to an NMOS SRAM device, but may be used in other places as well. The described method may also be used with both bipolar and CMOS process technologies, and may be used in the construction of any semiconductor device which requires a high resistance load element.

While a preferred embodiment has been described above, it will become apparent to those skilled in the art that various modifications may be made to such embodiment. Such modifications fall within the scope of the present invention, which is defined by the appended claims.

I claim:

1. An integrated circuit structure, comprising:

a substrate;

a first layer of patterned polycrystalline silicon interconnect covering a portion of the substrate and separated from the substrate by a first insulating layer;

a second insulating layer over the substrate and the first polycrystalline silicon layer, wherein the second insulating layer has openings therein which expose both portions of the first polycrystalline silicon layer and regions of the substrate adjacent to substrate regions immediately underlying such exposed portions; and a second layer of patterned polycrystalline silicon interconnect having areas of a first and second conductivity type the polycrystalline silicon overlying the second insulating layer, wherein the first conductivity type of the second polycrystalline silicon fills the openings and makes electrical contact with both the exposed first polycrystalline silicon layer portions and the exposed adjacent substrate regions within the openings, and wherein the first conductivity type of the second layer of patterned polycrystalline silicon is separated from another region of the first conductivity type by a region of a second conductivity types forming two PN junctions having an opposite orientation, positioned such that current flowing through the regions passes successively through the first conductivity type, then the second conductivity type, then the first conductivity type regions.

2. The structure of claim 1, wherein the first conductivity type is N-type, and the second conductivity type is P-type.

* * * * *